United States Patent
Coolbaugh et al.

(10) Patent No.: US 7,354,872 B2
(45) Date of Patent: Apr. 8, 2008

(54) HI-K DIELECTRIC LAYER DEPOSITION METHODS

(75) Inventors: Douglas D. Coolbaugh, Essex Junction, VT (US); Ebenezer E. Eshun, Essex Junction, VT (US); Kenneth J. Stein, Sandy Hook, CT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 10/908,789

(22) Filed: May 26, 2005

(65) Prior Publication Data
US 2006/0270247 A1   Nov. 30, 2006

(51) Int. Cl.
*H01L 21/31* (2006.01)
*H01L 21/469* (2006.01)

(52) U.S. Cl. ............. 438/778; 257/E21.478; 257/E21.494; 438/785; 438/789

(58) Field of Classification Search ........ 438/778, 438/785, 789, 790; 257/E21.478, E21.494
See application file for complete search history.

(56) References Cited

U.S. PATENT DOCUMENTS

| | | | |
|---|---|---|---|
| 5,468,687 A | 11/1995 | Carl et al. | 438/393 |
| 5,837,593 A | 11/1998 | Park et al. | 438/396 |
| 5,910,218 A | 6/1999 | Park et al. | 118/719 |
| 6,133,086 A | 10/2000 | Huang et al. | 438/240 |
| 6,555,394 B2 | 4/2003 | Park et al. | 438/3 |
| 6,720,275 B2 | 4/2004 | Park et al. | 438/785 |
| 6,939,760 B2 * | 9/2005 | Fujioka et al. | 438/240 |
| 2003/0209748 A1 | 11/2003 | Basceri et al. | 257/296 |
| 2004/0051132 A1 | 3/2004 | Li | 257/310 |
| 2004/0161883 A1 | 8/2004 | Colombo et al. | 438/197 |
| 2007/0020957 A1 * | 1/2007 | Mizushima et al. | 438/785 |

* cited by examiner

*Primary Examiner*—Caridad Everhart
(74) *Attorney, Agent, or Firm*—Anthony J. Canale; Hoffman, Warnick & D'Alessandro LLC

(57) ABSTRACT

Methods of forming a high dielectric constant dielectric layer are disclosed including providing a process chamber including a holder for supporting a substrate, introducing a first gas comprising a high dielectric constant (Hi-K) dielectric precursor and an oxygen ($O_2$) oxidant into the process chamber to form a first portion of the high dielectric constant dielectric layer on the substrate, and switching from a flow of the first gas to a flow of a second gas comprising the Hi-K dielectric precursor and an ozone ($O_3$) oxidant to form a second portion of the high dielectric constant dielectric layer on the first portion. In an alternative embodiment, another portion can be formed on the second portion using the oxygen oxidant. The invention increases throughput by at least 20% without reliability or leakage degradation and without the need for additional equipment.

20 Claims, 4 Drawing Sheets

HI-K DIELECTRIC LAYER DEPOSITION METHODS

BACKGROUND OF THE INVENTION

1. Technical Field

The present invention relates generally to semiconductor device fabrication, and more particularly, to methods of depositing a high dielectric constant (Hi-K) dielectric layer with increased throughput while maintaining low leakage and high reliability, and the layer formed.

2. Related Art

High dielectric constant (Hi-K) materials are currently being implemented in advanced semiconductor device fabrication. For example, the Hi-K materials are replacing dielectric materials such as silicon dioxide ($SiO_2$) and silicon nitride ($Si_3N_4$) used in passive devices (especially metal-insulator-metal capacitors). Such Hi-K materials increase the capacitance density with a thicker dielectric film by virtue of their higher dielectric constant. Overall, a Hi-K material that satisfies the industry reliability standard of 100,000 power-on-hours (POH) is desirable. For radio frequency (RF) applications, linearity (VCC), dielectric loss, and dielectric relaxation are also of importance. As the dielectric constant of materials increases, most of the above-described electrical parameters begin to degrade.

A challenge for Hi-K dielectric materials is obtaining high throughput of wafers during fabrication, while maintaining reliability. In particular, current deposition techniques such as atomic layer deposition (ALD) are extremely slow due to monolayer growth. Conventionally, there are two oxidants, which are used extensively, that can be used to deposit Hi-K dielectric materials: oxygen ($O_2$) and ozone ($O_3$). Ozone has a growth rate that could be, for example, 60% greater than oxygen, and thus allows a higher throughput. Unfortunately, ozone-based films results in a lower reliability than oxygen-based films, and thus cannot always be used.

In view of the foregoing, there is a need in the art for a method of depositing a Hi-K dielectric material that has increased throughput without loss of reliability.

SUMMARY OF THE INVENTION

The invention includes methods of forming a high dielectric constant dielectric layer including providing a process chamber including a holder for supporting a substrate, introducing a first gas comprising a high dielectric constant (Hi-K) dielectric precursor and an oxygen ($O_2$) oxidant into the process chamber to form a first portion of the high dielectric constant dielectric layer on the substrate, and switching from a flow of the first gas to a flow of a second gas comprising the Hi-K dielectric precursor and an ozone ($O_3$) oxidant to form a second portion of the high dielectric constant dielectric layer on the first portion. In an alternative embodiment, another portion can be formed on the second portion using the oxygen oxidant. The invention increases throughput by at least 20% without reliability or leakage degradation and without the need for additional equipment.

A first aspect of the invention is directed to a method of forming a high dielectric constant dielectric layer on a substrate, the method comprising the steps of: providing a process chamber including a holder for supporting a substrate; introducing a first gas comprising a high dielectric constant (Hi-K) dielectric precursor and an oxygen ($O_2$) oxidant into the process chamber to form a first portion of the high dielectric constant dielectric layer on the substrate; and switching from a flow of the first gas to a flow of a second gas comprising the Hi-K dielectric precursor and an ozone ($O_3$) oxidant to form a second portion of the high dielectric constant dielectric layer on the first portion.

A second aspect of the invention includes a method of forming a high dielectric constant dielectric layer on a substrate, the method comprising the steps of: providing a process chamber including a holder for supporting a substrate; introducing a first gas comprising a high dielectric constant (Hi-K) dielectric precursor and an oxygen ($O_2$) oxidant into the process chamber to form a first portion of the high dielectric constant dielectric layer on the substrate; switching from a flow of the first gas to a flow of a second gas comprising the Hi-K dielectric precursor and an ozone ($O_3$) oxidant to form a second portion of the high dielectric constant dielectric layer on the first portion; switching from the flow of the second gas to a flow of a third gas comprising the Hi-K dielectric precursor and an oxygen ($O_2$) oxidant to form a third portion of the high dielectric constant dielectric layer on the second portion; and maintaining the process chamber at a temperature of no less than approximately 350° C. and no greater than approximately 400° C. during the introducing and switching steps.

A third aspect of the invention related to a method of forming a high dielectric constant dielectric layer on a substrate, the method comprising the steps of: providing a process chamber including a holder for supporting a substrate; introducing a first gas comprising a high dielectric constant (Hi-K) dielectric precursor and an oxygen ($O_2$) oxidant into the process chamber to form a first portion of the high dielectric constant dielectric layer on the substrate; switching from a flow of the first gas to a flow of a second gas comprising the Hi-K dielectric precursor and an ozone ($O_3$) oxidant into the process chamber to form a second portion of the high dielectric constant dielectric layer on the first portion; and maintaining the process chamber at a temperature of no less than approximately 350° C. and no greater than approximately 400° C. during the introducing and switching steps.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
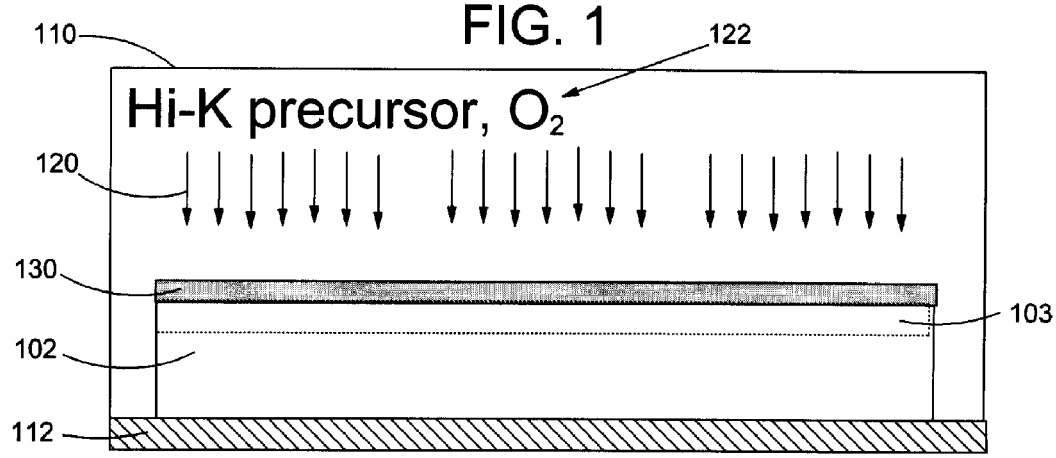
FIG. 1 shows a first step of a first embodiment of a method according to the invention.
Figure 2:
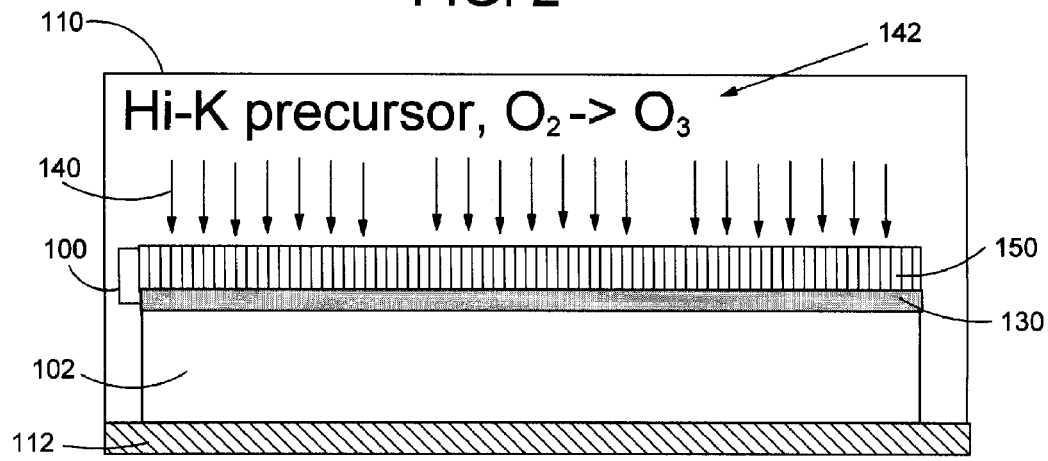
FIG. 2 shows a second step of a first embodiment of a method according to the invention.

With reference to the accompanying drawings, FIGS. 1-2 show a first embodiment of a method of forming a high dielectric constant (Hi-K) dielectric layer 100 on a substrate 102. In a first step shown in FIG. 1, the method includes providing a process chamber 110 including a holder 112 for supporting substrate 102, which could be, for instance, but is not limited to, copper (Cu), aluminum (Al), silicon (Si), a low dielectric constant layer 103 (in phantom in FIG. 1 only) such as one of: silicon dioxide ($SiO_2$), silicon nitride ($Si_3N_4$), aluminum oxide ($Al_2O_3$), etc. Next, a flow of a first gas 120 comprising a Hi-K dielectric precursor and an oxygen ($O_2$) oxidant 122 is introduced into process chamber 110 to form a first portion 130 of high dielectric constant dielectric layer 100 (FIG. 2) on substrate 102. The Hi-K dielectric precursor may include any now known or later developed Hi-K precursor such as $Ta(OC_2H_5)_5$ for tantalum pentaoxide ($Ta_2O_5$), $Hf[N(CH_3)_2]_4$ for hafnium dioxide ($HfO_2$) and $Zr[N(CH_3)_2]_4$ for zirconium oxide (ZrO) or another Hi-K dielectric precursor. During this step, the temperature in process chamber 110 is preferably maintained between approximately 350° C. and approximately 400° C., most preferably at approximately 380° C. In addition, during this step, a pressure in process chamber 110 may be maintained at approximately 3 Torr. Under these conditions, a growth rate of first portion 130 during this step may be approximately 15.3 Å/min. While the thickness of first portion 130 may vary depending on application, in one embodiment, first portion 130 may have a thickness between approximately 10 Å and approximately 100 Å.

As shown in FIG. 2, a next step includes (preferably gradually) switching the flow of first gas 120 (FIG. 1) to a flow of a second gas 140 comprising the Hi-K precursor and an ozone ($O_3$) oxidant 142 to form a second portion 150 of high dielectric constant dielectric layer 100 on first portion 130. During this step, the temperature in process chamber 110 is also preferably maintained between approximately 350° C. and approximately 400° C., most preferably at approximately 380° C. In addition, during this step, a pressure in process chamber 110 may be maintained at approximately 0.7 Torr. Under these conditions, a growth rate of second portion 150 during this step may be approximately 24 Å/min, which is significantly higher than the growth rate of first portion 130. While the thickness of first portion 130 may vary depending on application, in one embodiment, second portion 150 may have a thickness between approximately 100 Å and approximately 300 Å. (Note, the drawings are not drawn to scale).

Figure 3:
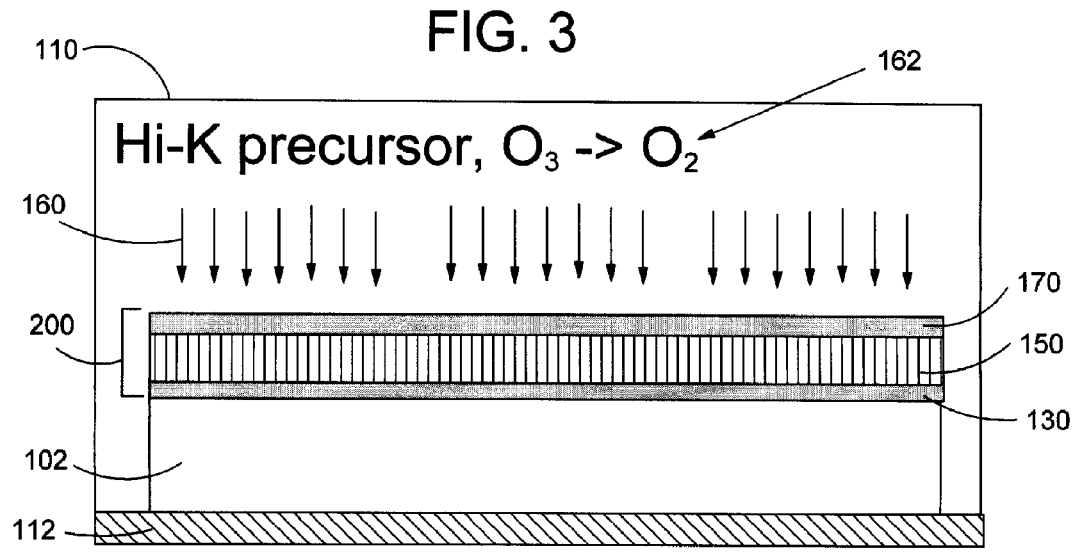
FIG. 3 shows a third step of an alternative second embodiment of a method according to the invention.

According to the first embodiment, deposition of Hi-K dielectric layer 100 may cease at this point, i.e., a flow of second gas 140 stops. In a second alternative embodiment, however, processing may proceed, as shown in FIG. 3, by (preferably gradually) switching from a flow of second gas 140 (FIG. 2) to a flow of a third gas 160 comprising the Hi-K precursor and an oxygen ($O_2$) oxidant 162 to form a third portion 170 of a high dielectric constant dielectric layer 200 on second portion 150. This step may proceed under substantially similar conditions as the deposition of first portion 130 so as to form a third portion 170 that is substantially identical to first portion 130, thus forming a balanced dielectric layer 200. In particular, during this step, the temperature in process chamber 110 is preferably maintained between approximately 350° C. and approximately 400° C., most preferably at approximately 380° C. In addition, during this step, a pressure in process chamber 110 may also be maintained at approximately 3 Torr. Under these conditions, a growth rate of third portion 170 may be approximately 15.3 Å/min. While the thickness of third portion 170 may vary depending on application, in one embodiment, third portion 170 may have a thickness between approximately 10 Å and approximately 100 Å, i.e., substantially identical to first portion 130.

In one embodiment, each of first and second portions 130, 150 and third portion 170, if provided, comprises tantalum pentaoxide ($Ta_2O_5$). That is, a tantalum precursor (e.g., $Ta(OC_2H_5)_5$) is injected into process chamber 110 during each step described above. It should be recognized that other Hi-K dielectrics such as hafnium dioxide ($HfO_2$), aluminum oxide ($Al_2O_3$), or zirconium oxide (ZrO) may also be formed using the appropriate Hi-K precursors, e.g., a hafnium precursor (e.g., $Hf[N(CH_3)_2]_4$) for hafnium dioxide ($HfO_2$) and a zirconium precursor (e.g., $Zr[N(CH_3)_2]_4$) for zirconium oxide (ZrO), respectively.

The use of oxygen-ozone, or oxygen-ozone-oxygen, to form a Hi-K dielectric layer 100, 200 significantly increases the throughput of wafers during fabrication. For example, the following table illustrates throughput versus oxidant used. All of the data below is generated using a temperature of 350° C. The pressures vary as described above.

| Oxidant Scenario: | Growth Rate (Å/min) | Film Thickness (Å) | Wafers/ hr | % Increase from $O_2$ |
|---|---|---|---|---|
| 1. $O_2$ alone | 15.3 | 250 | 3.6 | 0 |
| 2. $O_3$ alone | 24 | 250 | 5.76 | 60 |
| 3. $O_2/O_3$ | 15.3/24 | 50/200 | 5.17 | 44 |
| 4. $O_2/O_3$ | 15.3/24 | 100/150 | 4.7 | 31 |
| 5. $O_2/O_3$ | 15.3/24 | 150/100 | 4.3 | 19.4 |
| 6. $O_2/O_3/O_2$ | 15.3/24/15.3 | 25/200/25 | 5.17 | 44 |
| 7. $O_2/O_3/O_2$ | 15.3/24/15.3 | 50/150/50 | 4.7 | 31 |
| 8. $O_2/O_3/O_2$ | 15.3/24/15.3 | 75/100/75 | 4.3 | 19.4 |

As can be seen for the embodiments of the invention (scenarios 3-8), throughput increases anywhere from 19.4% to 60% compared to using oxygen ($O_2$) as the oxidant alone (scenario 1).

Figure 4:
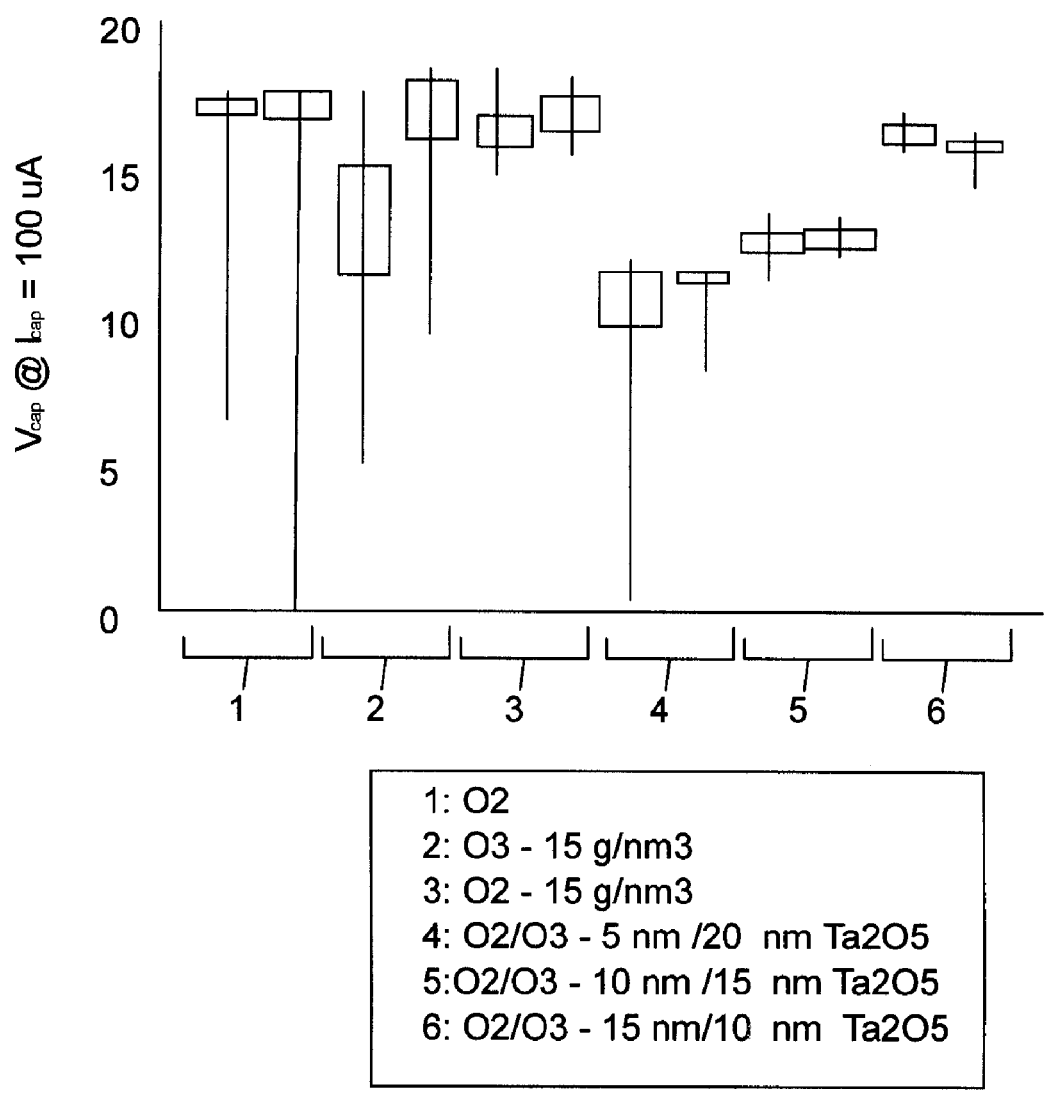
FIG. 4 shows a graph indicating breakdown voltage ranges for various dielectric layer formation techniques.

In terms of reliability, FIG. 4 shows a box chart illustrating breakdown voltages ($V_{BD}$) ranges results for Hi-K dielectrics formed according to the prior art (i.e., $O_2$ and $O_3$ alone) and for various versions of the first embodiment of the method of the invention described above. (The samples have an area/perimeter value of: 450 K$\mu m^2$/6.3 K$\mu m$.) The vertical axis represents breakdown voltage (Vcap) at a current (Icap) of 100 μA, and the horizontal axis represents the different oxidant scenarios. Each dielectric layer was formed to a thickness of 250 Å. Ideally, the values of $V_{BD}$ should be high, which indicates a high breakdown voltage, and vertically narrow (low spread), which indicates that the deposition technique is highly reliable and uniform. The first data set is for a dielectric layer formed using oxygen oxidant only, and indicates high $V_{BD}$ with low spread, which is desirable. As indicated above, however, an oxygen-only technique is too slow. The second data set is for a dielectric layer formed using ozone only, and indicates high, but unpredictable values of $V_{BD}$. The growth rate, however, was 24 Å/min, which is adequate. The third data set is for a dielectric layer formed using oxygen oxidant only, but accelerated to have the same growth rate, i.e., 24 Å/min, as the ozone-only data set. The third data set indicates high $V_{BD}$ and a lot better reliability than the second data set although they had the same growth rates—the only difference is the oxidant.

The fourth, fifth and sixth data sets are for a dielectric layer formed using oxygen followed by ozone, according to the invention. As shown in the legend of FIG. 4, the fourth data set has 50 Å (5 nm) of dielectric formed with oxygen and 200 Å formed using ozone; the fifth data set has 100 Å (10 nm) of dielectric formed with oxygen and 150 Å formed using ozone; and the sixth data set has 150 Å (15 nm) of dielectric formed with oxygen and 100 Å formed using ozone. As shown, each of the fourth, fifth and sixth data set has a relatively high $V_{BD}$ with fairly low spreads; the sixth data set being comparable to the first three data sets. The vertical narrowness of the $V_{BD}$ improves as the oxygen layer thickness increases from the fourth to the sixth data set, which indicates a dielectric layer formed using one of the techniques will have a high and reliable $V_{BD}$. In terms of throughput, the greater the contribution of ozone to the dielectric layer, the faster the deposition process. Hence, the fourth data set is the quickest, followed by the fifth and sixth. However, in terms of film reliability, the more dielectric layer that is deposited with oxygen, the higher the reliability. Hence, the sixth data set will be most reliable followed by the fifth and then the fourth. An optimized process may therefore lie somewhere in between the fourth data set and the sixth data set but is not necessarily limited to this range.

Figure 5:
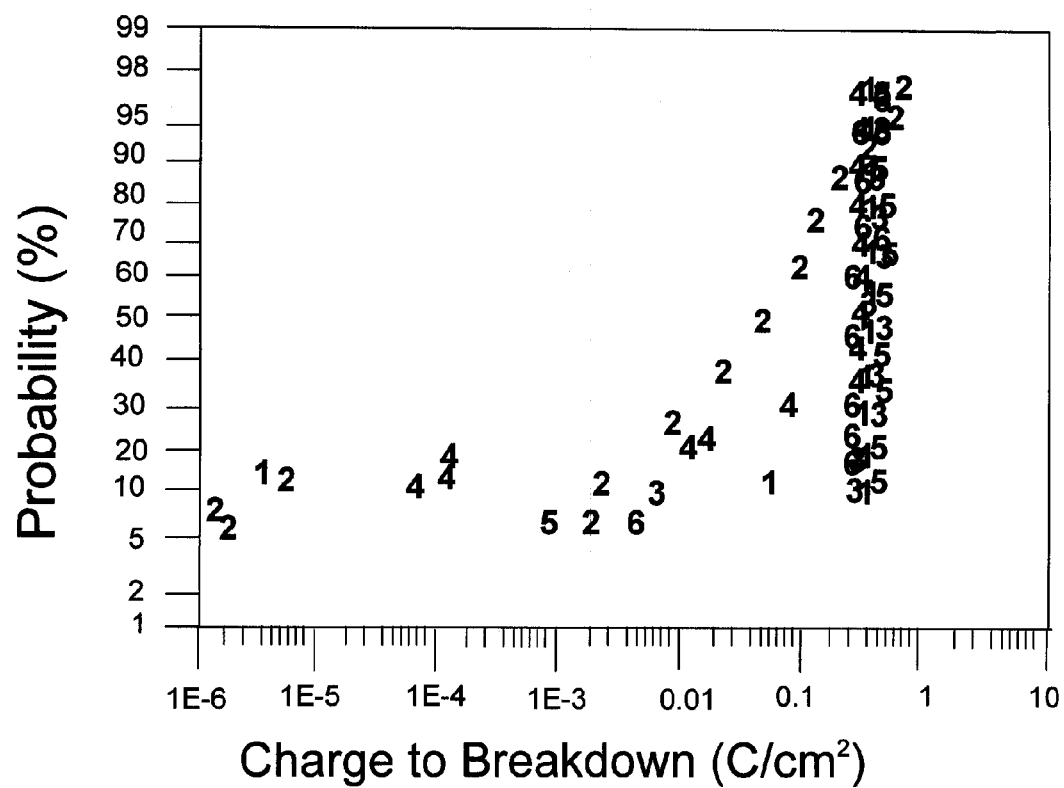
FIG. 5 shows a graph of breakdown charge versus probability of breakdown for the various dielectric layer formation techniques of FIG. 4.

Turning to FIG. 5, a graph illustrating charge to breakdown ($Q_{BD}$) on a horizontal axis versus probability of breakdown (%) on a vertical axis for the six data sets of FIG. 4 is shown. FIG. 5 shows that the fourth, fifth and sixth data sets also have a very tight distribution to create breakdown charges $Q_{BD}$ (i.e., a very steep slope), which is desirable. In contrast, the ozone only data set is much more dispersed.

It should be recognized that while certain operating conditions have been described with the various embodiments, other conditions may be used advantageously and are considered within the scope of the invention. For example, reducing the temperature for the deposition of first and second portion 130, 170, significantly improves the overall dielectric properties for the stack, thus making the stack more attractive for device applications. In addition, throughput may be increased by increasing the pressure during deposition of second portion 150.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a high dielectric constant dielectric layer on a substrate, the method comprising the steps of:
   providing a process chamber including a holder for supporting a substrate;
   introducing a first gas comprising a mixture of a high dielectric constant (Hi-K) dielectric precursor and an oxygen ($O_2$) oxidant into the process chamber to form a first portion of the high dielectric constant dielectric layer on the substrate; and
   switching from a flow of the first gas to a flow of a second gas comprising a mixture of the Hi-K dielectric precursor and an ozone ($O_3$) oxidant to form a second portion of the high dielectric constant dielectric layer on the first portion.

2. The method of claim 1, further comprising the steps of:
   switching from the flow of the second gas to a flow of a third gas comprising the Hi-K dielectric precursor and an oxygen ($O_2$) oxidant to form a third portion of the high dielectric constant dielectric layer on the second portion.

3. The method of claim 1, wherein the high dielectric constant dielectric layer comprises one of: tantalum pentaoxide ($Ta_2O_5$), hafnium dioxide ($HfO_2$) and zirconium oxide (ZrO).

4. The method of claim 1, wherein a growth rate of the first gas introducing step is approximately 15.3 Å/min; and a growth rate of the second gas introducing step is approximately 24 Å/min.

5. The method of claim 1, further comprising the step of maintaining the process chamber at a pressure of approximately 3 Torr during the first introducing step and at a pressure of approximately 0.7 Torr during the second introducing step.

6. The method of claim 1, wherein the first portion has a thickness of no less than approximately 1 Å and no greater than approximately 100 Å, and the second portion has a thickness of no less than approximately 100 Å and no greater than approximately 300 Å.

7. The method of claim 1, wherein the substrate includes a low dielectric constant layer including one of: silicon dioxide ($SiO_2$), silicon nitride ($Si_3N_4$) and aluminum oxide ($Al_2O_3$).

8. The method of claim 1, wherein the Hi-K precursor includes one of: $Ta(OC_2H_5)_5$, $Hf[N(CH_3)_2]_4$ and $Zr[N(CH_3)_2]_4$.

9. The method of claim 1, further comprising the step of maintaining the process chamber at a temperature of no less than approximately 350° C. and no greater than approximately 400° C. during the introducing steps.

10. The method of claim 9, wherein the temperature is approximately 380° C.

11. A method of forming a high dielectric constant dielectric layer on a substrate, the method comprising the steps of:
    providing a process chamber including a holder for supporting a substrate;
    introducing a first gas comprising a mixture of a high dielectric constant (Hi-K) dielectric precursor and an oxygen ($O_2$) oxidant into the process chamber to form a first portion of the high dielectric constant dielectric layer on the substrate;
    switching from a flow of the first gas to a flow of a second gas comprising a mixture of the Hi-K dielectric precursor and an ozone ($O_3$) oxidant to form a second portion of the high dielectric constant dielectric layer on the first portion;
    switching from the flow of the second gas to a flow of a third gas comprising a mixture of the Hi-K dielectric precursor and an oxygen ($O_2$) oxidant to form a third portion of the high dielectric constant dielectric layer on the second portion; and
    maintaining the process chamber at a temperature of no less than approximately 350° C. and no greater than approximately 400° C. during the introducing and switching steps.

12. The method of claim 11, wherein the high dielectric constant dielectric layer comprises tantalum pentaoxide ($Ta_2O_5$), hafnium dioxide ($HfO_2$), zirconium oxide (ZrO).

13. The method of claim 11, wherein the maintaining step includes maintaining the temperature at approximately 380° C.

14. The method of claim 11, wherein a growth rate of the first and third gas introducing steps is approximately 15.3 Å/min; and a growth rate of the second gas introducing step is approximately 24 Å/min.

15. The method of claim 11, wherein the first and third pressures are approximately 3 Torr and the second pressure is approximately 0.7 Torr.

16. The method of claim 11, wherein the first and third portion each have a thickness of no less than approximately 10 Å and no greater than approximately 100 Å.

17. The method of claim 11, wherein the second portion has a thickness of no less than approximately 100 Å and no greater than approximately 300 Å.

18. The method of claim 11, wherein the Hi-K precursor includes one of: $Ta(OC_2H_5)_5$, $Hf[N(CH_3)_2]_4$ and $Zr[N(CH_3)_2]_4$.

19. A method of forming a high dielectric constant dielectric layer on a substrate, the method comprising the steps of:

provm a process chamber including a holder for supporting a substrate;

introducing a first gas comprising a mixture of a high dielectric constant (Hi-K) dielectric precursor and an oxygen ($O_2$) oxidant into the process chamber to form a first portion of the high dielectric constant dielectric layer on the substrate;

switching from a flow of the first gas to a flow of a second gas comprising a mixture of the Hi-K dielectric precursor and an ozone ($O_3$) oxidant to form a second portion of the high dielectric constant dielectric layer on the first portion; and maintaining the process chamber at a temperature of no less than approximately 350° C. and no greater than approximately 400° C. during the introducing and switching steps.

20. The method of claim 19, further comprising the step of: switching from the flow of the second gas to a flow of a third gas comprising the Hi-K dielectric precursor and an oxygen ($O_2$) oxidant to form a third portion of the high dielectric constant dielectric layer on the second portion.

* * * * *